US012559837B2

(12) United States Patent
De Abreu Neto et al.

(10) Patent No.: US 12,559,837 B2
(45) Date of Patent: Feb. 24, 2026

(54) METHOD FOR DEPOSITING BORON NITRIDE

(71) Applicant: ASM IP Holding B.V., Almere (NL)

(72) Inventors: Miguel Sérgio De Abreu Neto, Leuven (BE); Jihee Jeon, Leuven (BE); Imane Abdellaoui, Leuven (BE); Timothee Blanquart, Oud-Heverlee (BE); René Henricus Jozef Vervuurt, Leuven (BE)

(73) Assignee: ASM IP Holding B.V., Almere (NL)

( * ) Notice: Subject to any disclaimer, the term of this patent is extended or adjusted under 35 U.S.C. 154(b) by 14 days.

(21) Appl. No.: 18/534,817

(22) Filed: Dec. 11, 2023

(65) Prior Publication Data

US 2024/0209499 A1 Jun. 27, 2024

Related U.S. Application Data

(60) Provisional application No. 63/432,417, filed on Dec. 14, 2022.

(51) Int. Cl.

*C23C 16/34* (2006.01)
*C23C 16/455* (2006.01)
*C23C 16/56* (2006.01)

(52) U.S. Cl.

CPC ...... *C23C 16/342* (2013.01); *C23C 16/45538* (2013.01); *C23C 16/56* (2013.01)

(58) Field of Classification Search

CPC ............ C23C 16/342; C23C 16/45538; C23C 16/45553

See application file for complete search history.

(56) References Cited

U.S. PATENT DOCUMENTS

| | | | | |
|---|---|---|---|---|
| 5,518,780 | A | 5/1996 | Tamor | |
| 10,840,087 | B2 * | 11/2020 | Weimer | H01L 21/02274 |
| 10,892,156 | B2 * | 1/2021 | Woodruff | C23C 16/345 |
| 2011/0244694 | A1 * | 10/2011 | Antonelli | H10D 30/792 257/E21.241 |
| 2013/0029498 | A1 * | 1/2013 | Nakano | H01L 21/02126 438/798 |
| 2018/0040476 | A1 * | 2/2018 | Wolf | H10D 64/691 |
| 2019/0097000 | A1 * | 3/2019 | Berry | H01L 21/02502 |
| 2020/0318237 | A1 * | 10/2020 | Fukazawa | C23C 16/45536 |
| 2022/0076996 | A1 * | 3/2022 | Blanquart | H01L 21/02205 |

(Continued)

OTHER PUBLICATIONS

Zhu, Lingling, et al., "Investigation on the synthesis of turbostratic boron nitride by solvothermal hot-press method". Solid State Sciences, 12 (2010) pp. 1084-1087.*

(Continued)

*Primary Examiner* — Bret P Chen

(74) *Attorney, Agent, or Firm* — Mark W. Scott; Laine IP Oy

(57) ABSTRACT

Methods for depositing a boron nitride film on a substrate are disclosed. More particularly, the disclosure relates to methods that can be used for depositing a boron nitride film by a PECVD process. The method comprises providing a substrate into a reaction chamber, and executing a cyclical deposition process comprising a plurality of deposition cycles, ones from the plurality of deposition cycles including providing a boron precursor into the reaction chamber and providing a deposition plasma gas into the reaction chamber.

17 Claims, 5 Drawing Sheets

(56) References Cited

U.S. PATENT DOCUMENTS

2023/0143678 A1* 5/2023 Vervuurt ............. H01L 21/0228
427/569

OTHER PUBLICATIONS

Bull, Sarah K., et al., "Atomic layer deposited boron nitride nanoscale films act as high temperature hydrogen barriers". Applied Surface Science 565 (2021) 150428, pp. 1-10.*

Lee, Jabeom, et al., "Atomic Layer Deposition of Layered Boron Nitride for Large-Area 2D Electronics". ACS Applied Materials & Interfaces, 2020, 12, 36688-36694.*

Weber, Matthieu, et al., "Mechanical properties of boron nitride thin films prepared by atomic layer deposition". CrystEngComm, 2017, 19, 6089-6094.*

Park, Hamin, et al., "Large-scale synthesis of uniform hexagonal boron nitride films by plasma-enhanced atomic layer deposition". Scientific Reports, 7:40091, Jan. 5, 2017, pp. 1-8.*

Sprenger, Jaclyn K., et al., "Electron-Enhanced Atomic Layer Deposition of Boron Nitride Thin Films at Room Temperature and 100° C.". J. Phys. Chem. C 2018, 122, 9455-9464.*

Park, Hamin, et al., "Large-scale synthesis of uniform hexagonal boron nitride films by plasma-enhanced atomic layer deposition". Scientific Reports, 7:40091, pp. 1-8.*

Chakrabarty, Kallol, et al., "Hexagonal boron nitride grown using high atomic boron emission during microwave plasma chemical vapor deposition". J. Vac. Sci. Technol. A 37(6), Nov./Dec. 2019, 061507, pp. 1-8.*

Borazine Safety Data Sheet, Biosynth Carbosynth.

Chemical deposition methods to the rescue, Mitch Jacoby, C&EN Chicago, cen.acs.org.

Ultralow-dielectric-constant amorphous boron nitride, Seokmo Hong et al, Nature Paper, vol. 582, Jun. 25, 2020.

* cited by examiner

300

PROVIDE SUBSTRATE WITHIN REACTION CHAMBER — 302

PROVIDE BORON PRECURSOR — 304

PROVIDE DEPOSITION PLASMA — 306

GENERATE DEPOSITION PLASMA — 308

PROVIDE CURING PLASMA — 310

GENERATE CURING PLASMA — 312

METHOD FOR DEPOSITING BORON NITRIDE

CROSS-REFERENCE TO RELATED APPLICATIONS

The present application claims priority to and the benefit of U.S. Provisional Application No. 63/432,417, filed Dec. 14, 2022, the entirety of which is incorporated by reference herein.

FIELD OF INVENTION

The present disclosure generally relates to methods and systems suitable for forming electronic devices. More particularly, the disclosure relates to methods and systems that can be used for depositing a boron nitride film by a pulsed deposition process.

BACKGROUND OF THE DISCLOSURE

The down-scaling of semiconductor devices has resulted in improvements in the speed and density of integrated circuits. However, the miniaturization of devices is limited by increased resistance of interconnects and capacitance delay. To overcome this, interconnect materials having low relative dielectric constants (κ-values), that have low wet etch rate ratios (WERR) relative to other commonly-used materials, that serve as metal diffusion barriers, and that are thermally, chemically, and mechanically stable, are desirable. This has been difficult to obtain with materials such as low-κ SiCO that generally exhibit poor thermo-mechanical properties.

It has been previously demonstrated that amorphous boron nitride can serve as a low-κ dielectric and a diffusion barrier in small, high-performance electronics. (Hong et al. Nature, vol. 582 (2020)). However, the stability of such films may be less than desired. Accordingly, improved methods and systems for forming boron nitride films are desired. Any discussion of problems and solutions set forth in this section has been included in this disclosure solely for the purposes of providing a context for the present disclosure, and should not be taken as an admission that any or all of the discussion was known at the time the invention was made.

SUMMARY OF THE DISCLOSURE

Exemplary embodiments of this disclosure provide a method for depositing a boron nitride film on a surface of a substrate. While the ways in which various embodiments of the present disclosure address drawbacks of prior methods are discussed in more detail below, in general, various embodiments of the disclosure provide methods that can be used to improve the stability and electrical properties of a boron nitride film, including low-k values, as well as low wet etch rate ratios (WERRs).

In various embodiments of the disclosure, a cyclic deposition method of depositing a boron nitride film on a surface of a substrate comprises providing a substrate into a reaction chamber, and executing a cyclical deposition process comprising a plurality of deposition cycles. One from the plurality of deposition cycles comprises providing a boron precursor into the reaction chamber, providing a deposition plasma gas into the reaction chamber and generating a deposition plasma. The boron precursor has a structure that corresponds to the general formula

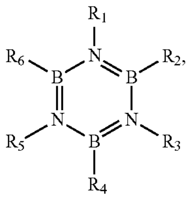

wherein at least two of $R_1$, $R_2$, $R_3$, $R_4$, $R_5$, and $R_6$ are a halogen.

In various embodiments, in the boron precursor at least three of $R_1$, $R_2$, $R_3$, $R_4$, $R_5$, and $R_6$ are a halogen.

In various embodiments, the $R_1$, $R_3$ and $R_5$ in the boron precursor are a halogen and each of $R_2$, $R_4$ and $R_6$ is selected from the group consisting of H and an alkyl group.

In various embodiments, the $R_2$, $R_4$ and $R_6$ in the boron precursor are a halogen and each of $R_1$, $R_3$ and $R_5$ is selected from the group consisting of H and an alkyl group.

In various embodiments, the alkyl group is methyl.

In various embodiments, wherein the halogen is chlorine.

In various embodiments, the boron precursor comprises trichloroborazine.

In various embodiments, the cyclical deposition process comprises continuously providing the deposition plasma gas into the reaction chamber.

In various embodiments, the method further comprises providing a curing plasma gas into the reaction chamber, and generating a curing plasma.

In various embodiments, the deposition plasma and curing plasma comprises at least one compound selected from the group consisting of hydrogen, noble gas and nitrogen.

In various embodiments, at least one of the deposition plasma or curing plasma comprises hydrogen.

In various embodiments, the boron precursor is pulsed into the precursor.

In various embodiments, the deposition plasma gas is provided into the chamber continuously during the pulsing of the precursor into the reaction chamber.

In various embodiments, the curing plasma gas is provided into the chamber after the deposition plasma.

In various embodiments, the deposition plasma and curing plasma is provided directly using capacitively coupled plasma.

In various embodiments, the cyclical deposition process comprises a cyclical plasma-enhanced chemical vapor deposition (PECVD) process.

In various embodiments, the cyclical deposition process comprises a cyclical plasma-enhanced atomic layer deposition (PEALD) process.

In various embodiments, a pressure within the reaction chamber is between 120 Pa and 2000 Pa.

In various embodiments, the temperature within the reaction chamber is between 75° C. and 500° C.

In various embodiments, the plasma is generated using an RF power of between about 25 W and about 500 W for a 300 mm substrate.

In various embodiments, a structure comprising a boron nitride film formed according to the method described in the current disclosure.

In various embodiments, the dielectric constant of the boron nitride film is less than 3.5. In various embodiments, the dielectric constant of the boron nitride film is less than 3.0. In various embodiments, the dielectric constant of the boron nitride film is less than 2.8.

In various embodiments, the wet etch rate of the boron nitride film is less than 0.5 Å/min in 1.5% hydrofluoric acid (HF). In various embodiments, the wet etch rate of the boron nitride film is less than 0.4 Å/min in 1.5% hydrofluoric acid (HF). In various embodiments, the wet etch rate of the boron nitride film is less than 0.3 Å/min in 1.5% hydrofluoric acid (HF). In various embodiments, the wet etch rate of the boron nitride film is less than 0.2 Å/min in 1.5% hydrofluoric acid (HF).

In various embodiments, the leakage value of the boron nitride film is less than 5e-8 $A/cm^2$ at 2 MV/cm electric field. In various embodiments, the leakage value of the boron nitride film is less than 4e-8 $A/cm^2$ at 2 MV/cm electric field. In various embodiments, the leakage value of the boron nitride film is less than 3e-8 $A/cm^2$ at 2 MV/cm electric field.

Further described herein is a reactor system for performing the methods of the present disclosure.

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

BRIEF DESCRIPTION OF THE DRAWING FIGURES

A more complete understanding of exemplary embodiments of the present disclosure can be derived by referring to the detailed description and claims when considered in connection with the following illustrative figures.

FIG. 1, panels A and B, illustrates a deposition sequence in accordance with at least one embodiment of the disclosure.

Figure 4:
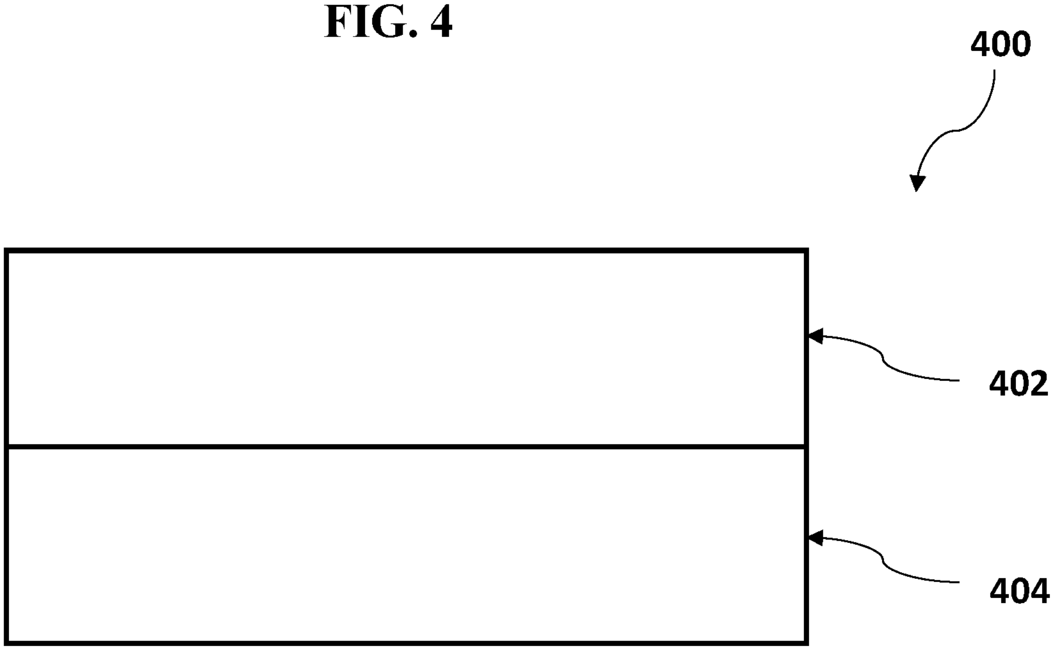

FIG. 4 illustrated a structure in accordance with at least one embodiment of the disclosure.

Figure 5:
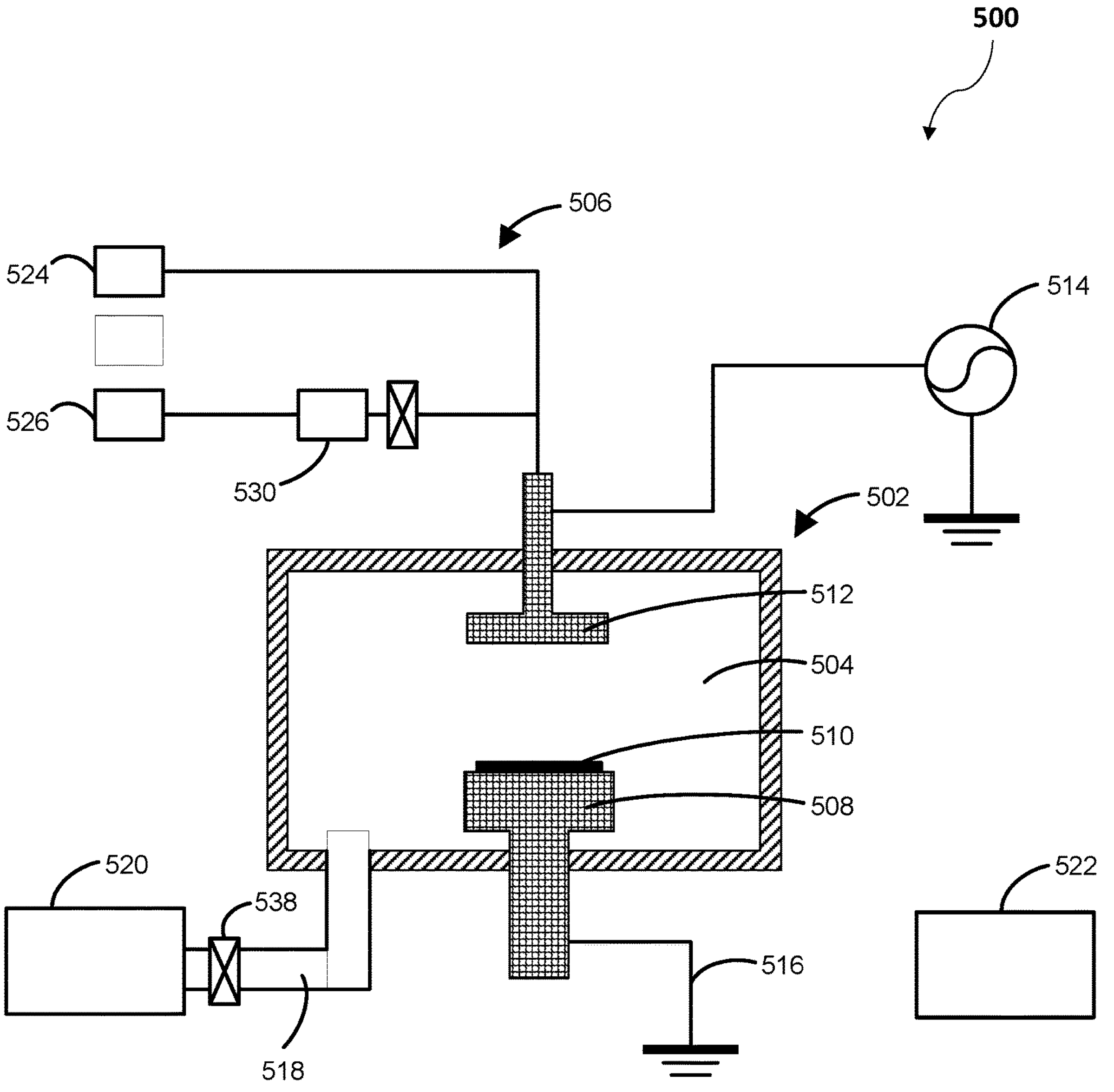

FIG. 5 illustrates a system in accordance with at least one embodiment of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below As used herein, the term “substrate” may refer to any underlying material or materials, including any underlying material or materials that may be modified, or upon which, a device, a circuit, or a film may be formed. The “substrate” may be continuous or non-continuous; rigid or flexible; solid or porous; and combinations thereof. The substrate may be in any form, such as a powder, a plate, or a workpiece. Substrates in the form of a plate may include wafers in various shapes and sizes. Substrates may be made from semiconductor materials, including, for example, silicon, silicon germanium, silicon oxide, gallium arsenide, gallium nitride and silicon carbide.

A continuous substrate may extend beyond the bounds of a process chamber where a deposition process occurs. In some processes, the continuous substrate may move through the process chamber such that the process continues until the end of the substrate is reached. A continuous substrate may be supplied from a continuous substrate feeding system to allow for manufacture and output of the continuous substrate in any appropriate form.

In some embodiments, the terms “film” and “layer” may be used interchangeably and refer to a layer extending in a direction perpendicular to a thickness direction to cover an entire target or concerned surface, or simply a layer covering a target or concerned surface. In some embodiments, the terms “film” or “layer” refer to a structure having a certain thickness formed on a surface. A film or layer may be constituted by a discrete single film or layer having certain characteristics. Alternatively, a film or layer may be constituted of multiple films or layers, and a boundary between adjacent films or layers may or may not be clear and may or may not be established based on physical, chemical, and/or any other characteristics, formation processes or sequence, and/or functions or purposes of the adjacent films or layers.

In some embodiments, “gas” can include material that is a gas at normal temperature and pressure, a vaporized solid and/or a vaporized liquid, and may be constituted by a single gas or a mixture of gases, depending on the context. A gas can include a process gas or other gas that passes through a gas supply unit, such as a shower plate, a gas distribution device, or the like. A gas can be a reactant or precursor that takes part in a reaction within a reaction chamber and/or include ambient gas, such as air.

The film can be formed using one or more of plasma-enhanced deposition process, such as plasma-enhanced atomic layer deposition (PEALD), and plasma-enhanced chemical vapor deposition (PECVD). The term “cyclical deposition process” or “cyclical deposition method” may refer to the sequential introduction of precursors (reactants) into a reaction chamber to deposit a layer over a substrate and includes processing techniques such as atomic layer deposition and cyclical chemical vapor deposition.

The term “cyclic chemical vapor deposition process” may refer to a chemical vapor deposition process in which one or more precursors are provided to a reaction chamber intermittently, i.e., in pulses. A plasma enhanced cyclic chemical vapor deposition process may refer to a cyclic chemical vapor deposition process in which a plasma is used to generate reactive species.

The term “atomic layer deposition” (ALD) may refer to a vapor deposition process in which deposition cycles, typically a plurality of consecutive deposition cycles, are conducted in a process chamber. Generally, during each cycle, a precursor is chemisorbed to a deposition surface (e.g., a substrate surface that can include a previously deposited material from a previous ALD cycle or other material), forming about a monolayer or sub-monolayer of material that does not readily react with additional precursor (i.e., a self-limiting reaction). Thereafter, in some cases, a co-reactant (e.g., another precursor or reaction gas) may subsequently be introduced into the process chamber for use in converting the chemisorbed precursor to the desired material on the deposition surface. The co-reactant can be capable of further reaction with the precursor. Further, purging steps can also be utilized during each cycle to remove excess precursor from the process chamber and/or remove excess co-reactant and/or reaction byproducts from the process chamber after conversion of the chemisorbed precursor. Further, the term atomic layer deposition, as used herein, is also meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursor(s)/reactive gas(es), and purge (e.g., inert carrier) gas(es).

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments. Percentages set forth herein are absolute percentages, unless otherwise noted.

It shall be understood that the term "comprising" is open ended and does not exclude the presence of other elements or components, unless the context clearly indicates otherwise. The term "comprising" includes the meaning of "consisting of." The term "consisting of" indicates that no other features or components are present than those mentioned, unless the context indicates otherwise.

The present disclosure generally relates to methods and systems for depositing a boron nitride film on a substrate. As set forth in more detail below, exemplary methods and systems described herein can be used to deposit boron nitride films with low-k value, low wet etch rate and improved electrical properties.

Figure 1A:
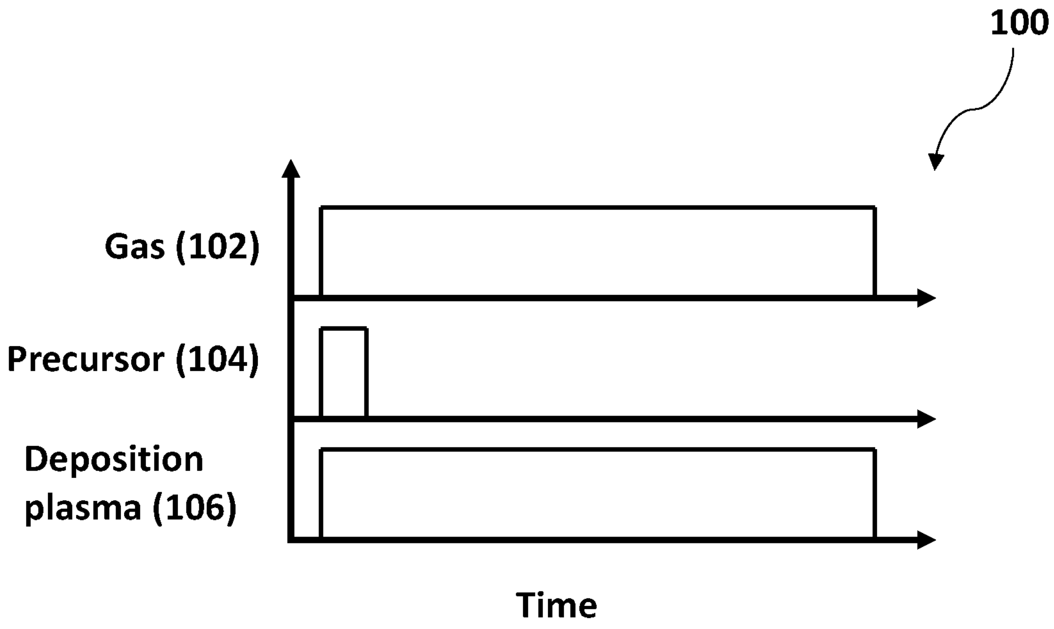

FIG. 1, panels A and B, illustrates a schematic representation of a deposition process sequence 100 in accordance with at least one embodiment of the disclosure. In FIG. 1A, a precursor 104 is pulsed into a reaction chamber, while a carrier gas 102 and deposition plasma 106 are provided continuously through the one precursor pulse.

Figure 1B:
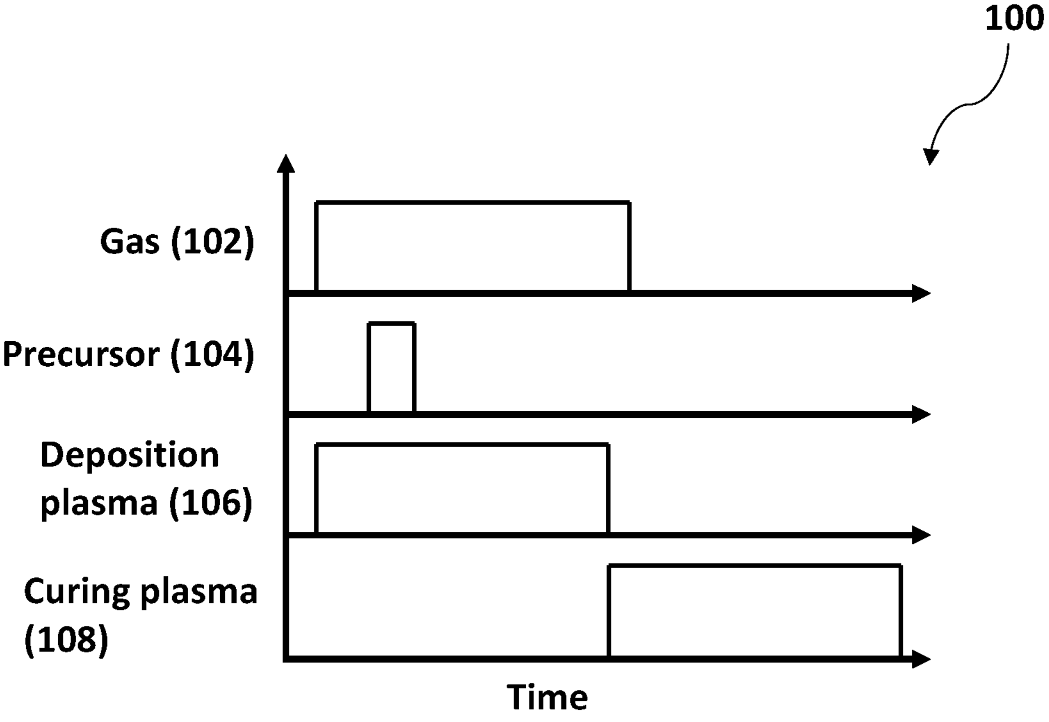

In FIG. 1B, similar to FIG. 1A a precursor 104 is pulsed into a reaction chamber, while a carrier gas 102 and deposition plasma 106 are provided continuously through the one precursor pulse. After this a curing plasma 108 is provided into the reaction chamber. This deposition cycle process can be divided into two sub-cycles. The first sub-cycle comprises the steps wherein the precursor 104 is pulsed into a reaction chamber, while a carrier gas 102 and a deposition plasma 106 are provided into the reaction chamber. The second sub-cycle comprises the step wherein the curing plasma 108 is provided into the reaction chamber. The deposition cycle may be repeated until a desired material thickness is achieved. For example about 50, 100, 150, 200, 250, 300, 400, 500, 600, 700, 800, 1,200 or 1,500 deposition cycles may be performed. The number of the first and the second sub-cycle may be equal, or the number of the first sub-cycles may be more than the second sub-cycles, or the number of the second sub-cycles may be more than the first sub-cycles. The number of the sub-cycles may be equal to the number of the deposition cycles.

Depending on the deposition conditions, deposition cycle numbers etc., film of variable thickness may be deposited. For example, a film may have a thickness between approximately 0.2 nm and 60 nm, or between about 2 nm and 40 nm, or between about 0.5 nm and 25 nm, or between about 1 nm and 50 nm, or between about 10 nm and 60 nm. A film may have a thickness of, for example, approximately 0.2 nm, 0.3 nm, 0.5 nm, 1 nm, 1.5 nm, 2 nm, 2.5 nm, 3 nm, 3.5 nm, 4 nm, 4.5 nm, 5 nm, 6 nm, 8 nm, 10 nm, 15 nm, 20 nm, 25 nm, 30 nm, 35 nm, 40 nm, 50 nm, 70 nm, 85 nm or 100 nm. The desired thickness may be selected according to the application in question.

Figure 2:
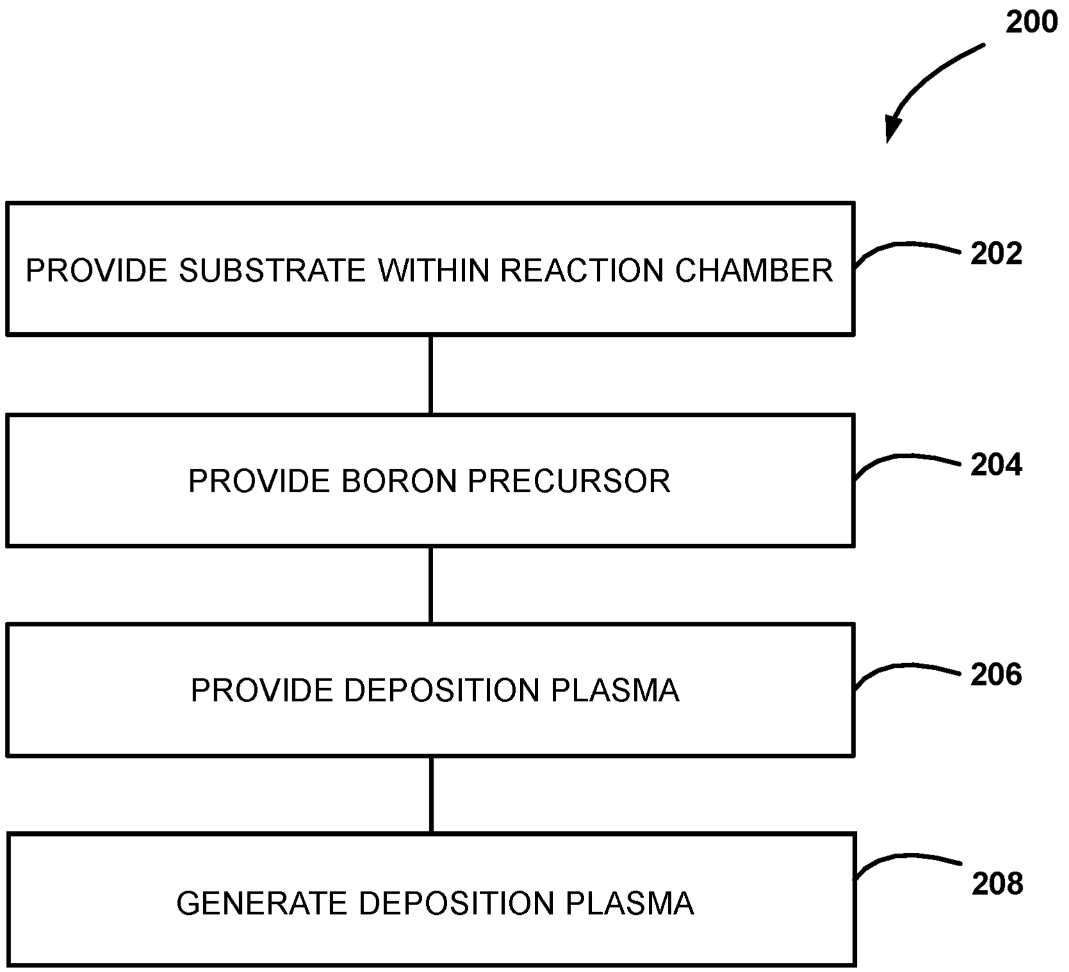
FIG. 2 illustrates a method in accordance with at least one embodiment of the disclosure.

FIG. 2 illustrates a method 200 of forming a boron nitride film on a substrate. Method 200 can be performed using process sequence 100. Method 200 includes the steps of providing a substrate within a reaction chamber 202, providing a boron precursor into the reaction chamber 204, providing a deposition plasma gas into the reaction chamber 206 and generating deposition plasma 208. The steps of providing a boron precursor 204, providing a deposition plasma gas 206 and generating deposition plasma 208 can overlap, as illustrated in the process sequence 100. Method steps of providing a boron precursor into the reaction chamber 204, providing a deposition plasma gas into the reaction chamber 206 and generating deposition plasma 208 can be the same or similar to process sequence steps precursor 104, gas 102 and plasma 106, respectively, described above. As used herein, overlap means that one or more steps overlap in time within a reaction chamber.

In some embodiments, the process is a cyclic PECVD process. In some embodiments, the cyclic PECVD process comprises pulsed precursor flow. Pulsed precursor flow comprises providing precursor to a reaction chamber in pulses, i.e. intermittently.

In step 202, a substrate is provided within a reaction chamber. The reaction chamber can then be brought to a process temperature and pressure. In some embodiments, the reaction chamber is maintained at a temperature of between 75° C. and 500° ° C., or between 150° C. and 400° C. throughout method 200. In some embodiments, the reaction chamber is maintained at a pressure of between 120 Pa to 2000 Pa, or between 150 Pa to 500 Pa throughout method 200.

During step 204, the boron precursor is provided to the reaction chamber. In some cases, during step 204, the precursor is mixed with a carrier gas. It shall be understood that a carrier gas refers to a gas that is used to carry or entrain a precursor to the reaction chamber. During step 204, the precursor may be provided as a pulse. The pulse time may be between 0.01 and 1 seconds, or between 0.1 and 0.5 seconds.

In some embodiments, the precursor consists of boron, nitrogen, and hydrogen. In some embodiments, the precursor can be represented by a chemical formula according to formula (a)

(a)

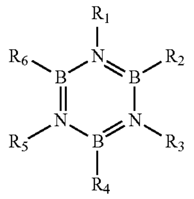

with $R_1$, $R_2$, $R_3$, $R_4$, $R_5$, and $R_6$ independently selected from H and a halogen. In some embodiments, at least one of $R_1$, $R_2$, $R_3$, $R_4$, $R_5$, and $R_6$ is a halogen. In some embodiments, at least two of $R_1$, $R_2$, $R_3$, $R_4$, $R_5$, and $R_6$ are a halogen. In some embodiments, at least three of $R_1$, $R_2$, $R_3$, $R_4$, $R_5$, and $R_6$ are a halogen. In some embodiments, the $R_1$, $R_3$ and $R_5$ are a halogen and each of $R_2$, $R_4$ and $R_6$ is selected from the group consisting of H and an alkyl group. In some embodiments, the precursor does not comprise carbon. In some embodiments, $R_2$, $R_4$ and $R_6$ are a halogen and each of $R_1$, $R_3$ and $R_5$ is selected from the group consisting of H and an alkyl group. In some embodiments, the alkyl group is a methyl. In some embodiments, the halogen selected from the group consisting of fluorine, chlorine, bromine and iodine Accordingly, in some embodiments, the precursor is trichloroborazine. The reaction chamber may be maintained at a temperature of between 300 and 500° C., or at 400° C., and a pressure of between 150 to 300 Pa during step 304, as noted above.

During step 306, the deposition plasma gas is provided to the reaction chamber. In some embodiments, the deposition plasma gas is nitrogen or hydrogen gas. In some embodiments, the deposition plasma gas comprises nitrogen and hydrogen. In some embodiments, the deposition plasma gas is an argon-containing gas. In some embodiments the argon-containing gas also includes hydrogen or nitrogen. In some embodiments, the deposition plasma gas includes between 30 and 99% hydrogen and/or between 1 and 70% nitrogen. In some embodiments, the deposition plasma gas includes between 10 and 90% nitrogen and/or between 10 and 90% hydrogen.

In some embodiments, the flow rate of the plasma gas (e.g., hydrogen and/or nitrogen) is between 0.75 and 20 slm, or 2.5 slm. The reaction chamber may be maintained at a temperature of between 300 and 500° C., or at 400° C., and a pressure of between 150 to 300 Pa during step 304, as noted above.

In step 308, the plasma may be an RF plasma. In some cases, the plasma is a direct plasma formed within the reaction chamber. In some embodiments, a plasma power of between 100 W to 450 W, for example 150 W to 300 W, is used for forming the plasma. It shall be understood that these plasma power ranges are provided for 300 mm wafers. The ranges can be readily converted to units of $W/cm^2$ to obtain equivalent RF power values for different substrate sizes.

In some embodiments, the plasma is provided directly using capacitively coupled plasma (CCP). In some embodiments, the plasma is provided as remote plasma. In some embodiments, a plasma frequency of between 100 kHz and 2 GHz is used. In some embodiments, a plasma frequency of 13.56 MHz is used. The reaction chamber may be maintained at a temperature of between 75° C. and 500° ° C., or between 150° C. and 400° ° C., and at a pressure of between 120 Pa to 2000 Pa, or between 150 Pa to 500 Pa during step 308, as noted above.

In some embodiments, the boron nitride film may be deposited at a rate of 0.03 nm/min. In some embodiments, the boron nitride film may be deposited at a rate of greater than 0.03 nm/min, or greater than 0.05 nm/min.

Figure 3:
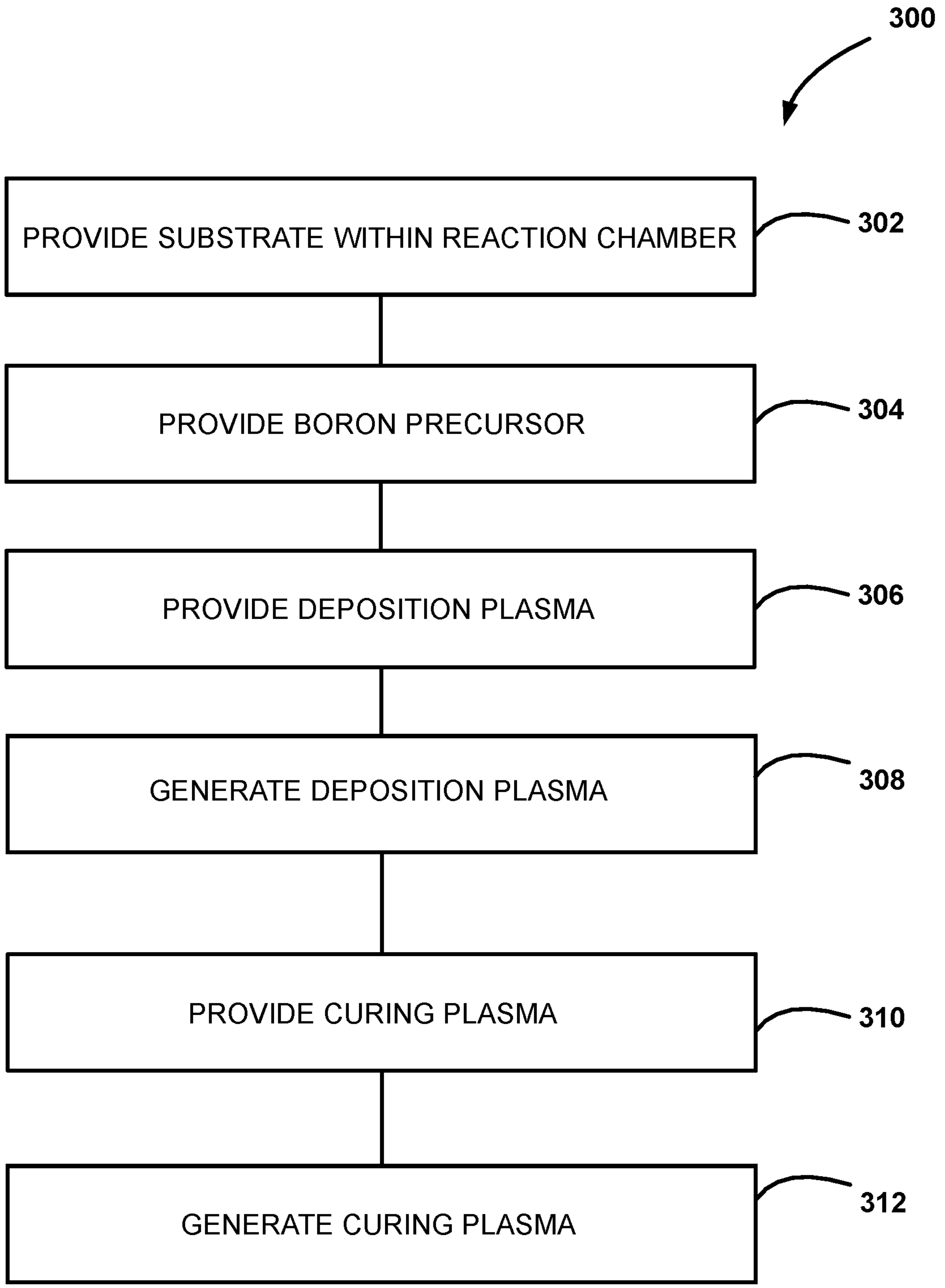
FIG. 3 illustrates a method in accordance with at least one embodiment of the disclosure.

FIG. 3 illustrated a method 300 of forming a boron nitride film on a substrate. Method 300 can be performed using process sequence 100. Method 300 includes the steps of providing a substrate within a reaction chamber 302, providing a boron precursor into the reaction chamber 304, providing a deposition plasma gas into the reaction chamber 306, generating deposition plasma 308, providing a curing plasma gas into the reaction chamber 310 and generating curing plasma 312. Steps 302-308 are similar to steps 202-208 described above in accordance with FIG. 2.

During step 310, the curing plasma is provided to the reaction chamber. In some embodiments, the curing plasma gas is a noble gas or hydrogen gas. In some embodiments, the curing plasma gas comprises hydrogen and a noble gas, such as helium. In some embodiments, the curing plasma gas includes between 30 and 99% hydrogen and/or between 1 and 70% helium. In some embodiments, the curing plasma gas includes between 10 and 90% helium and/or between 10 and 90% hydrogen.

In some embodiments, either the deposition plasma in step 308 or the curing plasma in step 310 is hydrogen. The hydrogen can be in a mixture comprising other elements, such as noble gases and nitrogen. For example, if the deposition plasma comprises hydrogen, the curing plasma may or may not comprise hydrogen. And, if the curing plasma comprises hydrogen, the deposition plasma may or may not comprise hydrogen.

In some embodiments, the flow rate of the plasma gas (e.g., hydrogen and/or nitrogen) is between 0.75 and 20 slm, or 2.5 slm. The reaction chamber may be maintained at a temperature of between 300 and 500° C., or at 400° C., and a pressure of between 150 to 300 Pa during step 304, as noted above.

In step 310, the plasma may be an RF plasma. In some cases, the plasma is a direct plasma formed within the reaction chamber. In some embodiments, a plasma power of between 100 W to 450 W, for example 150 W to 300 W, is used for forming the plasma. It shall be understood that these plasma power ranges are provided for 300 mm wafers. The ranges can be readily converted to units of $W/cm^2$ to obtain equivalent RF power values for different substrate sizes.

In some embodiments, the plasma is provided directly using capacitively coupled plasma (CCP). In some embodiments, the plasma is provided as remote plasma. In some embodiments, a plasma frequency of between 100 kHz and 2 GHz is used. In some embodiments, a plasma frequency of 13.56 MHz is used. The reaction chamber may be maintained at a temperature of between 75° C. and 500° C., or between 150° C. and 400° C., and at a pressure of between 120 Pa to 2000 Pa, or between 150 Pa to 500 Pa during step 310, as noted above.

FIG. 4 illustrates a structure 400 in accordance with exemplary embodiments of the disclosure. Structure 400 can be formed, at least in part, according to a method as described herein, such as method 200 or 300.

Structure 400 includes a substrate 404 and a boron nitride film 402 formed, e.g. using method 200/300 and/or process sequence 100. The dielectric constant of the boron nitride film 402 may be less than 3.5, less than 2.8, less than 2, or between about 2.8 and about 3.5, or between about 2 and about 3, or between about 1.5 and about 2. The leakage value of the boron nitride film 402 may be less than 5e-8 $A/cm^2$ at 2 MV/cm electric field, less than 4e-8 $A/cm^2$ at 2 MV/cm electric field or less than 3e-8 $A/cm^2$ at 2 MV/cm electric field. The wet etch rate of the boron nitride film 402 may be less than 0.5 Å/min in 1.5% hydrofluoric acid (HF), less than 0.4 Å/min in 1.5% hydrofluoric acid (HF), less than 0.3 Å/min in 1.5% hydrofluoric acid (HF) or less than 0.2 Å/min in 1.5% hydrofluoric acid (HF).

FIG. 5 illustrates a system 500 in accordance with exemplary embodiments of the disclosure. System 500 can be used to perform a method as described herein and/or to form a structure, or portion thereof, as described herein.

System 500 includes a reaction chamber 502, including a reaction space 504, a susceptor 508 to support a substrate 510, a gas distribution assembly 512, a gas supply system 506, a plasma power source 514, and a vacuum source 520. System 500 can also include a controller 522 to control various components of system 500.

Reaction chamber 502 can include any suitable reaction chamber, such as a plasma-enhanced chemical vapor deposition (PECVD) reaction chamber.

Susceptor 508 can include one or more heaters to heat substrate 510 to a desired temperature. Further, susceptor 508 can form an electrode. In the illustrated example, susceptor 508 forms an electrode coupled to ground 516.

Gas distribution assembly 512 can distribute gas to reaction space 504. In accordance with exemplary embodiments of the disclosure, gas distribution assembly 512 includes a showerhead, which can form an electrode. In the illustrated example, gas distribution assembly 512 is coupled to a power source 514, which provides power to gas distribution assembly 512 to produce a plasma with reaction space 504 (between gas distribution assembly 512 and susceptor 508). Power source 514 can be an RF power supply.

Gas supply system 506 can include one or more gas sources 524 and 526, and a precursor source 530. Gas source 524 can include, for example, a plasma gas as described herein. Precursor source 530 can include a precursor as described herein. Vacuum source 520 can include any suitable vacuum pump, such as a dry pump. Vacuum source 520 can be coupled to reaction chamber 502 via line 518 and controllable valve 538.

Controller 522 can be coupled to various valves, flowmeters (e.g., coupled to one or more of sources 524 and 526), heaters, thermocouples, and the like of system 500. Controller 522 can be configured to cause system 500 to perform various steps as described herein.

The illustrations presented herein are not meant to be actual views of any particular material, structure, or device, but are merely idealized representations that are used to describe embodiments of the disclosure.

The particular implementations shown and described are illustrative of the invention and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems, and configurations, and other features, functions, acts, and/or properties disclosed herein, as well as any and all equivalents thereof.

The invention claimed is:

1. A method for forming a film comprising boron nitride on a surface of a substrate, the method comprising:

providing a substrate into a reaction chamber; and executing a cyclical deposition process comprising a plurality of deposition cycles, ones from the plurality of deposition cycles comprising:

pulsing a boron precursor into the reaction chamber;

providing a deposition plasma gas into the reaction chamber; and generating a deposition plasma, wherein the boron precursor has a structure that corresponds to the general formula:

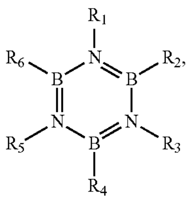

wherein at least two of $R_1$, $R_2$, $R_3$, $R_4$, $R_5$, and $R_6$ are a halogen, and wherein, during the ones from the plurality of deposition cycles, the deposition plasma is provided continuously into the reaction chamber for a first duration, and wherein the boron precursor is pulsed into the reaction chamber for a second duration which is less than the first duration.

2. The method according to claim 1, wherein at least three of $R_1$, $R_2$, $R_3$, $R_4$, $R_5$, and $R_6$ are a halogen.

3. The method according to claim 2, wherein the halogen is chlorine.

4. The method according to claim 1, wherein $R_1$, $R_3$ and $R_5$ are a halogen and each of $R_2$, $R_4$ and $R_6$ is selected from the group consisting of H and an alkyl group.

5. The method according to claim 4, wherein the alkyl group is methyl.

6. The method according to claim 1, wherein $R_2$, $R_4$ and $R_6$ are a halogen and each of $R_1$, $R_3$ and $R_5$ is selected from the group consisting of H and an alkyl group.

7. The method according to claim 1, wherein the boron precursor comprises trichloroborazine.

8. The method according to claim 1, wherein the method further comprises providing a curing plasma gas into the reaction chamber, and generating a curing plasma.

9. The method according to claim 8, wherein the deposition plasma and curing plasma comprises at least one compound selected from the group consisting of hydrogen, noble gas and nitrogen.

10. The method according to claim 9, wherein at least one of the deposition plasma or the curing plasma comprises hydrogen.

11. The method according to claim 8, wherein the curing plasma gas is provided into the reaction chamber after the deposition plasma.

12. The method according to claim 8, wherein the deposition plasma and the curing plasma are provided directly using capacitively coupled plasma.

13. The method according to claim 1, wherein a pressure within the reaction chamber is between 120 Pa and 2000 Pa.

14. The method according to claim 1, wherein the temperature within the reaction chamber is between 75° C. and 500° C.

15. The method according to claim 1, wherein the deposition plasma is generated using an RF power of between about 25 W and about 500 W for a 300 mm substrate.

16. The method according to claim 1, wherein at least one of $R_1$, $R_2$, $R_3$, $R_4$, $R_5$, and $R_6$ is an alkyl group.

17. The method according to claim 1, wherein the deposition plasma comprises hydrogen or a noble gas.

* * * * *